(12) United States Patent
Han et al.

(10) Patent No.: US 9,116,406 B2
(45) Date of Patent: Aug. 25, 2015

(54) PIXEL STRUCTURE AND LIQUID CRYSTAL DISPLAY DEVICE

(71) Applicant: SHENZHEN CHINA STAR OPTOELECTRONICS TECHNOLOGY CO., LTD., Shenzhen (CN)

(72) Inventors: Bing Han, Shenzhen (CN); JinJie Wang, Shenzhen (CN)

(73) Assignee: SHENZHEN CHINA STAR OPTOELECTRONICS TECHNOLOGY CO. LTD., Shenzhen (CN)

( * ) Notice: Subject to any disclaimer, the term of this patent is extended or adjusted under 35 U.S.C. 154(b) by 107 days.

(21) Appl. No.: 14/234,412

(22) PCT Filed: Jan. 6, 2014

(86) PCT No.: PCT/CN2014/070142
§ 371 (c)(1),
(2) Date: Jan. 23, 2014

(87) PCT Pub. No.: WO2015/096197
PCT Pub. Date: Jul. 2, 2015

(65) Prior Publication Data
US 2015/0185573 A1    Jul. 2, 2015

(30) Foreign Application Priority Data
Dec. 27, 2013   (CN) .......................... 2013 1 0739990

(51) Int. Cl.
*G02F 1/1343* (2006.01)
*G02F 1/136* (2006.01)
*G09G 3/32* (2006.01)
*G09G 3/36* (2006.01)
*G02F 1/1362* (2006.01)
*G02F 1/1368* (2006.01)
*H01L 27/12* (2006.01)

(52) U.S. Cl.
CPC ........ *G02F 1/136286* (2013.01); *G02F 1/1368* (2013.01); *G02F 1/134336* (2013.01); *G02F 1/136213* (2013.01); *H01L 27/124* (2013.01); *H01L 27/1255* (2013.01); *G02F 2001/134354* (2013.01)

(58) Field of Classification Search
CPC ................... G02F 1/136213; G02F 1/136207; G02F 1/136286; G02F 2001/134345; G02F 1/1368; H01L 27/12; H01L 27/1214; G09G 3/3648; G09G 3/3614; G09G 3/3688; G09G 3/3659
USPC ....................... 349/38, 39, 42, 43; 345/82, 90
See application file for complete search history.

(56) References Cited

U.S. PATENT DOCUMENTS 6,140,993 A * 10/2000 Pathak et al. ................. 345/100
8,040,447 B2 * 10/2011 You et al. ....................... 349/39

* cited by examiner

*Primary Examiner* — Mike Qi
(74) *Attorney, Agent, or Firm* — Mark M Friedman

(57) ABSTRACT

A pixel structure and a liquid crystal display device are disclosed. The pixel structure is formed on a substrate. The substrate includes at least two scan lines and at least one data line formed thereon. The pixel structure includes a main pixel, a first subpixel, and a second subpixel. The main pixel is electrically coupled to one of the two scan lines and the data line. The first subpixel is electrically coupled to the two scan lines and the data line. The second subpixel is electrically coupled to the two scan lines and the first subpixel. The present invention is capable of solving the color shift problem without a high frequency driving method and a large number of scan lines.

15 Claims, 3 Drawing Sheets

PIXEL STRUCTURE AND LIQUID CRYSTAL DISPLAY DEVICE

BACKGROUND OF THE INVENTION

1. Field of the Invention

The present invention generally relates to a pixel, and more particularly to a pixel structure and a liquid crystal display device having the pixel structure.

2. Description of Prior Art

In a liquid crystal display device, images seen from different viewing angles are different due to the characteristics of liquid crystals. That is, an image seen from a positive viewing angle is normal, but the image seen from a large viewing angle is abnormal. This description refers to a color shift problem at a large viewing angle.

Please refer to FIG. 1, FIG. 1 illustrates a conventional liquid crystal display device 1 for solving the color shift problem. A plurality of pixel structures 12 is formed on a substrate 10. Each of the pixel structures 12 comprises three subpixels 120, 122, and 124. The subpixels 120, 122, and 124 are driven by different voltages. A scan driving unit 14 is utilized for turning on or turning off thin film transistors (TFTs) 16 which are electrically coupled to the subpixels 120, 122, and 124. When an image is refreshed at a frequency of 60 hertz (Hz), a data driving unit 18 needs to drive the subpixels 120, 122, and 124 at a frequency of 240 Hz, which comprises the time of driving the subpixels 120, 122, and 124 and the time of black insertion. Furthermore, since each of the pixel structures 12 needs three data lines for providing voltages, the cost of the liquid crystal display device 1 is increased.

Consequently, there is a need to solve the problems that the subpixels need to be driven at a high frequency and a large number of data lines are required when the color shift problem is solved in the prior art.

SUMMARY OF THE INVENTION

An objective of the present invention is to provide a pixel structure and a liquid crystal display device capable of solving the color shift problem without a high frequency driving method and a large number of scan lines.

To solve the above-mentioned problem, a pixel structure provided by the present invention is formed on a substrate. The substrate comprises at least two scan lines and at least one data line formed thereon. The pixel structure comprises a main pixel, a first subpixel, and a second subpixel. The main pixel comprises a first thin film transistor and a first storage capacitor. A gate of the first thin film transistor is electrically coupled to one of the two scan lines. A source of the first thin film transistor is electrically coupled to the data line. A drain of the first thin film transistor is electrically coupled to a first end of the first storage capacitor. A second end of the first storage capacitor is electrically coupled to a common electrode. The first subpixel comprises a second thin film transistor, a third thin film transistor, a second storage capacitor, and a third storage capacitor. A gate of the second thin film transistor is electrically coupled to the one of the two scan lines. A source of the second thin film transistor is electrically coupled to the data line. A drain of the second thin film transistor is electrically coupled to a first end of the second storage capacitor and a source of the third thin film transistor. A second end of the second storage capacitor is electrically coupled to the common electrode. A gate of the third thin film transistor is electrically coupled to the other one of the two scan lines. A drain of the third thin film transistor is electrically coupled to a first end of the third storage capacitor. A second end of the third storage capacitor is electrically coupled to the common electrode. A second subpixel comprises a fourth thin film transistor, a fifth thin film transistor, and a fourth storage capacitor. A gate of the fourth thin film transistor is electrically coupled to the one of the two scan lines. A source of the fourth thin film transistor is electrically coupled to the source of the second thin film transistor. A drain of the fourth thin film transistor is electrically coupled to a first end of the fourth storage capacitor and a source of the fifth thin film transistor. A second end of the fourth storage capacitor is electrically coupled to the common electrode. A gate of the fifth thin film transistor is electrically coupled to the other one of the two scan lines. Different voltages are provided for the main pixel, the first subpixel, and the second subpixel by the first to the fifth thin film transistors and the first to the fourth storage capacitors.

In the pixel structure of the present invention, the main pixel further comprises a first liquid crystal capacitor. A first end of the first liquid crystal capacitor is electrically coupled to the drain of the first thin film transistor. A second end of the first liquid crystal capacitor is electrically coupled to a ground.

In the pixel structure of the present invention, the first subpixel further comprises a second liquid crystal capacitor. A first end of the second liquid crystal capacitor is electrically coupled to the drain of the second thin film transistor. A second end of the second liquid crystal capacitor is electrically coupled to the ground.

In the pixel structure of the present invention, the second subpixel further comprises a third liquid crystal capacitor. A first end of the third liquid crystal capacitor is electrically coupled to the drain of the fifth thin film transistor. A second end of the third liquid crystal capacitor is electrically coupled to the ground.

In the pixel structure of the present invention, a relationship of a voltage $V_A$ applied to the main pixel, a voltage $V_B$ applied to the first subpixel, and a voltage $V_C$ applied to the second subpixel is: $V_A > V_B > V_C$.

To solve the above-mentioned problem, a pixel structure provided by the present invention is formed on a substrate. The substrate comprises at least two scan lines and at least one data line formed thereon. The pixel structure comprises a main pixel, a first subpixel, and a second subpixel. The main pixel is electrically coupled to one of the two scan lines and the data line. The first subpixel is electrically coupled to the two scan lines and the data line. The second subpixel is electrically coupled to the two scan lines and the first subpixel.

In the pixel structure of the present invention, the main pixel comprises a first thin film transistor, a first storage capacitor, and a first liquid crystal capacitor. A gate of the first thin film transistor is electrically coupled to the one of the two scan lines. A source of the first thin film transistor is electrically coupled to the data line. A drain of the first thin film transistor is electrically coupled to a first end of the first storage capacitor and a first end of the first liquid crystal capacitor. A second end of the first storage capacitor is electrically coupled to a common electrode. A second end of the first liquid crystal capacitor is electrically coupled to a ground.

In the pixel structure of the present invention, the first subpixel comprises a second thin film transistor, a third thin film transistor, a second liquid crystal capacitor, a second storage capacitor, and a third storage capacitor. A gate of the second thin film transistor is electrically coupled to the one of the two scan lines. A source of the second thin film transistor is electrically coupled to the data line. A drain of the second thin film transistor is electrically coupled to a first end of the second liquid crystal capacitor, a first end of the second storage capacitor, and a source of the third thin film transistor. A second end of the second liquid crystal capacitor is electrically coupled to the ground. A second end of the second storage capacitor is electrically coupled to the common electrode. A gate of the third thin film transistor is electrically coupled to the other one of the two scan lines. A drain of the third thin film transistor is electrically coupled to a first end of the third storage capacitor. A second end of the third storage capacitor is electrically coupled to the common electrode.

In the pixel structure of the present invention, the second subpixel comprises a fourth thin film transistor, a fifth thin film transistor, a fourth storage capacitor, and a third liquid crystal capacitor. A gate of the fourth thin film transistor is electrically coupled to the one of the two scan lines. A source of the fourth thin film transistor is electrically coupled to the source of the second thin film transistor. A drain of the fourth thin film transistor is electrically coupled to a first end of the fourth storage capacitor and a source of the fifth thin film transistor. A second end of the fourth storage capacitor is electrically coupled to the common electrode. A gate of the fifth thin film transistor is electrically coupled to the other one of the two scan lines. A drain of the fifth thin film transistor is electrically coupled to a first end of the third liquid crystal capacitor. A second end of the third liquid crystal capacitor is electrically coupled to the ground.

In the pixel structure of the present invention, a relationship of a voltage $V_A$ applied to the main pixel, a voltage $V_B$ applied to the first subpixel, and a voltage $V_C$ applied to the second subpixel is: $V_A > V_B > V_C$.

To solve the above-mentioned problem, a liquid crystal display device provided by the present invention comprises a substrate, a plurality of scan lines, a plurality of data lines, and a plurality of pixel structures. The scan lines and the data lines cross each other and are formed on the substrate. Each of the pixel structures is electrically coupled to two of the scan lines and one of the data lines. Each of the pixel structures comprises a main pixel, a first subpixel, and a second subpixel. The main pixel is electrically coupled to one of the two scan lines and the data line. The first subpixel is electrically coupled to the two scan lines and the data line. The second subpixel electrically coupled to the two scan lines and the first subpixel.

In the liquid crystal display device of the present invention, the main pixel comprises a first thin film transistor, a first storage capacitor, and a first liquid crystal capacitor. A gate of the first thin film transistor is electrically coupled to the one of the two scan lines. A source of the first thin film transistor is electrically coupled to the data line. A drain of the first thin film transistor is electrically coupled to a first end of the first storage capacitor and a first end of the first liquid crystal capacitor. A second end of the first storage capacitor is electrically coupled to a common electrode. A second end of the first liquid crystal capacitor is electrically coupled to a ground.

In the liquid crystal display device of the present invention, the first subpixel comprises a second thin film transistor, a third thin film transistor, a second liquid crystal capacitor, a second storage capacitor, and a third storage capacitor. A gate of the second thin film transistor is electrically coupled to the one of the two scan lines. A source of the second thin film transistor is electrically coupled to the data line. A drain of the second thin film transistor is electrically coupled to a first end of the second liquid crystal capacitor, a first end of the second storage capacitor, and a source of the third thin film transistor. A second end of the second liquid crystal capacitor is electrically coupled to the ground. A second end of the second storage capacitor is electrically coupled to the common electrode. A gate of the third thin film transistor is electrically coupled to the other one of the two scan lines. A drain of the third thin film transistor is electrically coupled to a first end of the third storage capacitor. A second end of the third storage capacitor is electrically coupled to the common electrode.

In the liquid crystal display device of the present invention, the second subpixel comprises a fourth thin film transistor, a fifth thin film transistor, a fourth storage capacitor, and a third liquid crystal capacitor. A gate of the fourth thin film transistor is electrically coupled to the one of the two scan lines. A source of the fourth thin film transistor is electrically coupled to the source of the second thin film transistor. A drain of the fourth thin film transistor is electrically coupled to a first end of the fourth storage capacitor and a source of the fifth thin film transistor. A second end of the fourth storage capacitor is electrically coupled to the common electrode. A gate of the fifth thin film transistor is electrically coupled to the other one of the two scan lines. A drain of the fifth thin film transistor is electrically coupled to a first end of the third liquid crystal capacitor. A second end of the third liquid crystal capacitor is electrically coupled to the ground.

In the liquid crystal display device of the present invention, a relationship of a voltage $V_A$ applied to the main pixel, a voltage $V_B$ applied to the first subpixel, and a voltage $V_C$ applied to the second subpixel is: $V_A > V_B > V_C$.

Compared with the prior arts, the pixel structure and the liquid crystal display device of the present invention are capable of solving the color shift problem without a high frequency driving method and a large number of scan lines.

For a better understanding of the aforementioned content of the present invention, preferable embodiments are illustrated in accordance with the attached figures for further explanation:

DETAILED DESCRIPTION OF THE INVENTION

The following descriptions for the respective embodiments are specific embodiments capable of being implemented for illustrations of the present invention with reference to the appended figures.

Figure 1:
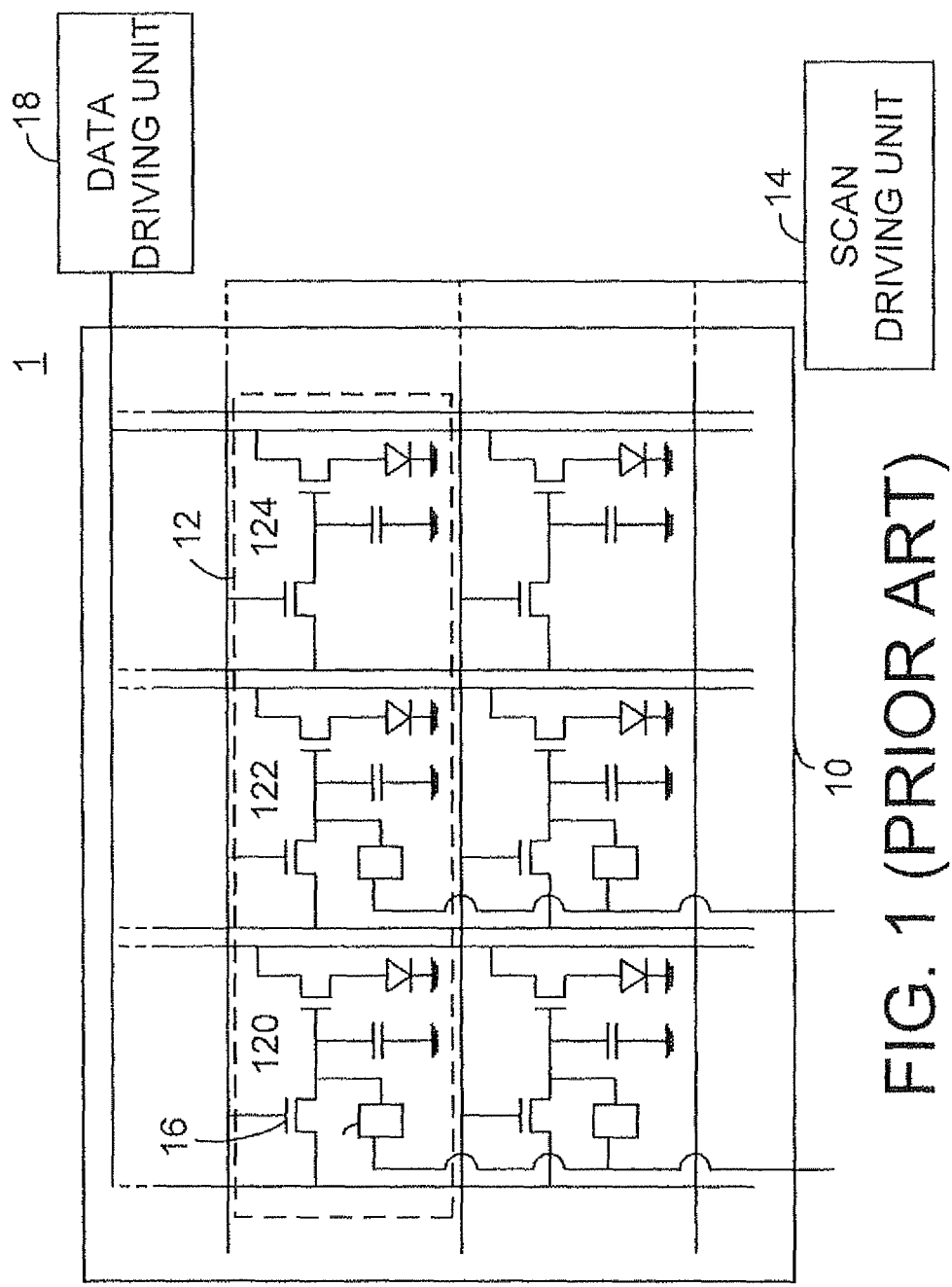
FIG. 1 illustrates a conventional liquid crystal display device for solving the color shift problem.
Figure 2:
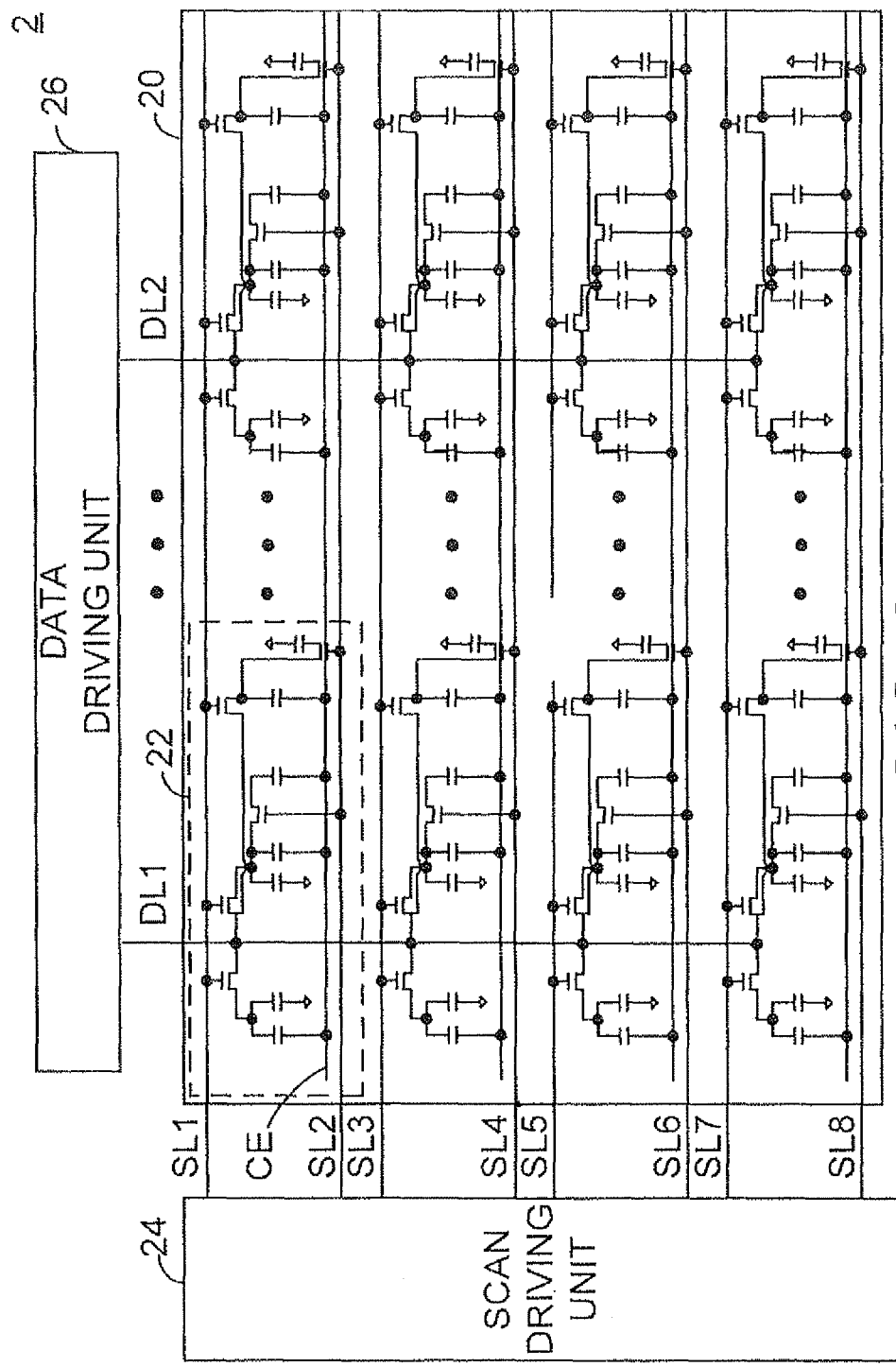
FIG. 2 illustrates a liquid crystal display device in accordance with an embodiment of the present invention.

Please refer to FIG. 2. FIG. 2 illustrates a liquid crystal display device 2 in accordance with an embodiment of the present invention. The liquid crystal display device 2 comprises a substrate 20, a plurality of scan lines SL1-SL8, a plurality of data lines DL1-DL2, a plurality of pixel structures 22, at least one scan driving unit 24, and at least one data driving unit 26.

The substrate 20 is a thin film transistor (TFT) array substrate. The scan lines SL1-SL8 and the data lines DL1-DL2 cross each other perpendicularly and are formed on the substrate 20. The scan lines SL1-SL8 and the data lines DL1-DL2 define the pixel structures 22. Each of the pixel structures 22 is electrically coupled to two of the scan lines SL1-SL8 and one of the data lines DL1-DL2.

Figure 3:
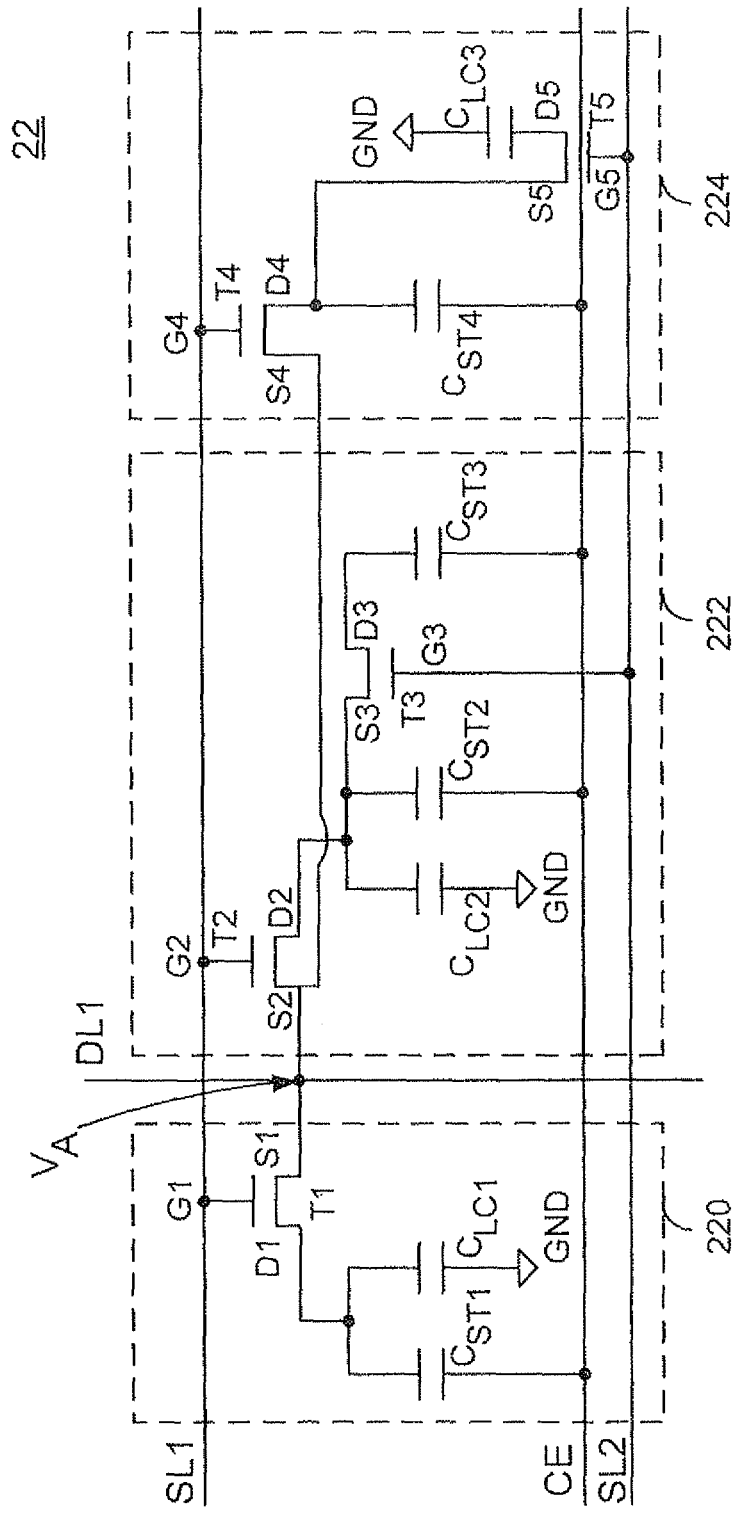
FIG. 3 illustrates an enlarged view of one pixel structure in FIG. 2.

Please refer to FIG. 2 and FIG. 3. FIG. 3 illustrates an enlarged view of one pixel structure 22 in FIG. 2.

The pixel structure 22 comprises a main pixel 220, a first subpixel 222, and a second subpixel 224.

The main pixel 220 comprises a first thin film transistor T1, a first storage capacitor $C_{ST1}$, and a first liquid crystal capacitor $C_{LC1}$. A gate G1 of the first thin film transistor T1 is electrically coupled to the scan line SL1. A source S1 of the first thin film transistor T1 is electrically coupled to the data line DL1. A drain D1 of the first thin film transistor T1 is electrically coupled to a first end of the first storage capacitor $C_{ST1}$ and a first end of the first liquid crystal capacitor $C_{LC1}$. A second end of the first storage capacitor $C_{ST1}$ is electrically coupled to a common electrode CE. A second end of the first liquid crystal capacitor $C_{LC1}$ is electrically coupled to a ground GND.

The first subpixel 222 comprises a second thin film transistor T2, a third thin film transistor T3, a second liquid crystal capacitor $C_{LC2}$, a second storage capacitor $C_{ST2}$, and a third storage capacitor $C_{ST3}$. A gate G2 of the second thin film transistor T2 is electrically coupled to the scan line SL1. A source 62 of the second thin film transistor T2 is electrically coupled to the data line DL1. A drain D2 of the second thin film transistor T2 is electrically coupled to a first end of the second liquid crystal capacitor $C_{LC2}$, a first end of the second storage capacitor $C_{ST2}$, and a source S3 of the third thin film transistor T3. A second end of the second liquid crystal capacitor $C_{LC2}$ is electrically coupled to the ground GND. A second end of the second storage capacitor $C_{ST2}$ is electrically coupled to the common electrode CE. A gate G3 of the third thin film transistor T3 is electrically coupled to the scan line SL2. A drain D3 of the third thin film transistor T3 is electrically coupled to a first end of the third storage capacitor $C_{ST3}$. A second end of the third storage capacitor $C_{ST3}$ is electrically coupled to the common electrode CE.

The second subpixel 224 comprises a fourth thin film transistor T4, a fifth thin film transistor T5, a fourth storage capacitor $C_{ST4}$, and a third liquid crystal capacitor $C_{LC3}$. A gate G4 of the fourth thin film transistor T4 is electrically coupled to the scan line SL1. A source S4 of the fourth thin film transistor T4 is electrically coupled to the source S2 of the second thin film transistor T2. A drain D4 of the fourth thin film transistor T4 is electrically coupled to a first end of the fourth storage capacitor $C_{ST4}$ and a source S5 of the fifth thin film transistor T5. A second end of the fourth storage capacitor $C_{ST4}$ is electrically coupled to the common electrode CE. A gate G5 of the fifth thin film transistor T5 is electrically coupled to the scan line SL2. A drain D5 of the fifth thin film transistor T5 is electrically coupled to a first end of the third liquid crystal capacitor $C_{LC3}$. A second end of the third liquid crystal capacitor $C_{LC3}$ is electrically coupled to the ground GND.

It can be seen from FIG. 2 that the scan line SL1 is utilized for turning on or turning off the first thin film transistor T1, the second thin film transistor T2, and the fourth thin film transistor T4, and the scan line SL2 is utilized for turning on or turning off the third thin film transistor T3 and the fifth thin film transistor T5.

When the scan driving unit 24 scans the scan line SL1, the first thin film transistor T1, the second thin film transistor T2, and the fourth thin film transistor T4 are turned on. The first storage capacitor $C_{ST1}$, the first liquid crystal capacitor $C_{LC1}$, the second liquid crystal capacitor $C_{LC2}$, the second storage capacitor $C_{ST2}$, and the fourth storage capacitor $C_{ST4}$ are charged.

When the scan driving unit 24 scans the scan line SL2, the third thin film transistor T3 and the fifth thin film transistor T5 are turned on. The second liquid crystal capacitor $C_{LC2}$ and the second storage capacitor $C_{ST2}$ charge the third storage capacitor $C_{ST3}$. The fourth storage capacitor $C_{ST4}$ charges the third liquid crystal capacitor $C_{LC3}$.

The liquid crystal display device 2 of the present invention provides different voltages for the main pixel 220, the first subpixel 222, and the second subpixel 224 with a capacitance voltage division principle, so that the orientation angles of the liquid crystals corresponding to the main pixel 220, the first subpixel 222, and the second subpixel 224 are different. Accordingly, the color shift problem at a large angle can be solved.

More particularly, the liquid crystal display device 2 of the present invention provides the different voltages for the main pixel 220, the first subpixel 222, and the second subpixel 224 by utilizing the first to the fifth thin film transistors T1-T5 and the first to the fourth storage capacitors $C_{ST1}$-$C_{ST4}$. After experimental verification, preferred capacitance values of the above-mentioned capacitors are designed so that a relationship of a voltage $V_A$ applied to the main pixel 220, a voltage $V_B$ applied to the first subpixel 222, and a voltage $V_C$ applied to the second subpixel 224 is: $V_A > V_B > V_C$. That is, it has the best effect on solving the color shift problem.

Furthermore, the pixel structures of the liquid crystal display device of the present invention can be formed by the following five manufacturing processes. In a first manufacturing process, the gates, the scan lines, and the common electrode are formed. In a second manufacturing process, a semiconductor layer is formed. In a third manufacturing process, the sources, the drains, and the data lines are formed. In a fourth manufacturing process, via holes are formed. In a fifth manufacturing process, the pixel structures are formed. That is, the main pixels, the first subpixels, and the second subpixels are formed. The above-mentioned five manufacturing processes are known by one skilled in the art of the present invention, and thus they are omitted herein.

The liquid crystal display device of the present invention has the specific design of the main pixel, the first subpixel, and the second subpixel, so that the orientation angles of the liquid crystals corresponding to the main pixel, the first subpixel, and the second subpixel are different. Accordingly, the color shift problem at a large angle can be solved. More particularly, the present invention is capable of solving the color shift problem without a high frequency driving method and a large number of data lines.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structures.

What is claimed is:

1. A pixel structure, which is formed on a substrate, the substrate comprising at least two scan lines and at least one data line formed thereon, the pixel structure comprising:
    a main pixel comprising a first thin film transistor and a first storage capacitor, a gate of the first thin film transistor electrically coupled to one of the two scan lines, a source of the first thin film transistor electrically coupled to the data line, a drain of the first thin film transistor electrically coupled to a first end of the first storage capacitor, and a second end of the first storage capacitor electrically coupled to a common electrode;
    a first subpixel comprising a second thin film transistor, a third thin film transistor, a second storage capacitor, and a third storage capacitor, a gate of the second thin film transistor electrically coupled to the one of the two scan lines, a source of the second thin film transistor electrically coupled to the data line, a drain of the second thin film transistor electrically coupled to a first end of the second storage capacitor and a source of the third thin film transistor, a second end of the second storage capacitor electrically coupled to the common electrode, a gate of the third thin film transistor electrically coupled to the other one of the two scan lines, a drain of the third thin film transistor electrically coupled to the a first end of the third storage capacitor, and a second end of the third storage capacitor electrically coupled to the common electrode; and a second subpixel comprising a fourth thin film transistor, a fifth thin film transistor, and a fourth storage capacitor, a gate of the fourth thin film transistor electrically coupled to the one of the two scan lines, a source of the fourth thin film transistor electrically coupled to the source of the second thin film transistor, a drain of the fourth thin film transistor electrically coupled to a first end of the fourth storage capacitor and a source of the fifth thin film transistor, a second end of the fourth storage capacitor electrically coupled to the common electrode, and a gate of the fifth thin film transistor electrically coupled to the other one of the two scan lines, wherein different voltages are provided for the main pixel, the first subpixel, and the second subpixel by the first to the fifth thin film transistors and the first to the fourth storage capacitors.

2. The pixel structure of claim 1, wherein the main pixel further comprises a first liquid crystal capacitor, a first end of the first liquid crystal capacitor is electrically coupled to the drain of the first thin film transistor, and a second end of the first liquid crystal capacitor is electrically coupled to a ground.

3. The pixel structure of claim 2, wherein the first subpixel further comprises a second liquid crystal capacitor, a first end of the second liquid crystal capacitor is electrically coupled to the drain of the second thin film transistor, and a second end of the second liquid crystal capacitor is electrically coupled to the ground.

4. The pixel structure of claim 3, wherein the second subpixel further comprises a third liquid crystal capacitor, a first end of the third liquid crystal capacitor is electrically coupled to the drain of the fifth thin film transistor, and a second end of the third liquid crystal capacitor is electrically coupled to the ground.

5. The pixel structure of claim 1, wherein a relationship of a voltage $V_A$ applied to the main pixel, a voltage $V_B$ applied to the first subpixel, and a voltage $V_C$ applied to the second subpixel is: $V_A > V_B > V_C$.

6. A pixel structure, which is formed on a substrate, the substrate comprising at least two scan lines and at least one data line formed thereon, the pixel structure comprising:
    a main pixel electrically coupled to one of the two scan lines and the data line;
    a first subpixel electrically coupled to the two scan lines and the data line; and
    a second subpixel electrically coupled to the two scan lines and the first subpixel.

7. The pixel structure of claim 6, wherein the main pixel comprises:
    a first thin film transistor;
    a first storage capacitor; and
    a first liquid crystal capacitor,
    a gate of the first thin film transistor is electrically coupled to the one of the two scan lines, a source of the first thin film transistor is electrically coupled to the data line, a drain of the first thin film transistor is electrically coupled to a first end of the first storage capacitor and a first end of the first liquid crystal capacitor, a second end of the first storage capacitor is electrically coupled to a common electrode, and a second end of the first liquid crystal capacitor is electrically coupled to a ground.

8. The pixel structure of claim 7, wherein the first subpixel comprises:
    a second thin film transistor;
    a third thin film transistor;
    a second liquid crystal capacitor;
    a second storage capacitor; and
    a third storage capacitor,
    a gate of the second thin film transistor is electrically coupled to the one of the two scan lines, a source of the second thin film transistor is electrically coupled to the data line, a drain of the second thin film transistor is electrically coupled to a first end of the second liquid crystal capacitor, a first end of the second storage capacitor, and a source of the third thin film transistor, a second end of the second liquid crystal capacitor is electrically coupled to the ground, a second end of the second storage capacitor is electrically coupled to the common electrode, a gate of the third thin film transistor is electrically coupled to the other one of the two scan lines, a drain of the third thin film transistor is electrically coupled to the a first end of the third storage capacitor, and a second end of the third storage capacitor is electrically coupled to the common electrode.

9. The pixel structure of claim 8, wherein the second subpixel comprises:
    a fourth thin film transistor;
    a fifth thin film transistor;
    a fourth storage capacitor; and
    a third liquid crystal capacitor,
    a gate of the fourth thin film transistor is electrically coupled to the one of the two scan lines, a source of the fourth thin film transistor is electrically coupled to the source of the second thin film transistor, a drain of the fourth thin film transistor is electrically coupled to a first end of the fourth storage capacitor and a source of the fifth thin film transistor, a second end of the fourth storage capacitor is electrically coupled to the common electrode, a gate of the fifth thin film transistor is electrically coupled to the other one of the two scan lines, a drain of the fifth thin film transistor is electrically coupled to a first end of the third liquid crystal capacitor, and a second end of the third liquid crystal capacitor is electrically coupled to the ground.

10. The pixel structure of claim 6, wherein a relationship of a voltage $V_A$ applied to the main pixel, a voltage $V_B$ applied to the first subpixel, and a voltage $V_C$ applied to the second subpixel is: $V_A > V_B > V_C$.

11. A liquid crystal display device, comprising:
    a substrate;
    a plurality of scan lines;
    a plurality of data lines, the scan lines and the data lines crossing each other and formed on the substrate; and
    a plurality of pixel structures, each of the pixel structures electrically coupled to two of the scan lines and one of the data lines,
    each of the pixel structures comprising:
    a main pixel electrically coupled to one of the two scan lines and the data line;
    a first subpixel electrically coupled to the two scan lines and the data line; and a second subpixel electrically coupled to the two scan lines and the first subpixel.

12. The liquid crystal display device of claim 11, wherein the main pixel comprises:
    a first thin film transistor;
    a first storage capacitor; and
    a first liquid crystal capacitor,
    a gate of the first thin film transistor is electrically coupled to the one of the two scan lines, a source of the first thin film transistor is electrically coupled to the data line, a drain of the first thin film transistor is electrically coupled to a first end of the first storage capacitor and a first end of the first liquid crystal capacitor, a second end of the first storage capacitor is electrically coupled to a common electrode, and a second end of the first liquid crystal capacitor is electrically coupled to a ground.

13. The liquid crystal display device of claim 12, wherein the first subpixel comprises:
    a second thin film transistor;
    a third thin film transistor;
    a second liquid crystal capacitor;
    a second storage capacitor; and
    a third storage capacitor,
    a gate of the second thin film transistor is electrically coupled to the one of the two scan lines, a source of the second thin film transistor is electrically coupled to the data line, a drain of the second thin film transistor is electrically coupled to a first end of the second liquid crystal capacitor, a first end of the second storage capacitor, and a source of the third thin film transistor, a second end of the second liquid crystal capacitor is electrically coupled to the ground, a second end of the second storage capacitor is electrically coupled to the common electrode, a gate of the third thin film transistor is electrically coupled to the other one of the two scan lines, a drain of the third thin film transistor is electrically coupled to the a first end of the third storage capacitor, and a second end of the third storage capacitor is electrically coupled to the common electrode.

14. The liquid crystal display device of claim 13, wherein the second subpixel comprises:
    a fourth thin film transistor;
    a fifth thin film transistor;
    a fourth storage capacitor; and
    a third liquid crystal capacitor,
    a gate of the fourth thin film transistor is electrically coupled to the one of the two scan lines, a source of the fourth thin film transistor is electrically coupled to the source of the second thin film transistor, a drain of the fourth thin film transistor is electrically coupled to a first end of the fourth storage capacitor and a source of the fifth thin film transistor, a second end of the fourth storage capacitor is electrically coupled to the common electrode, a gate of the fifth thin film transistor is electrically coupled to the other one of the two scan lines, a drain of the fifth thin film transistor is electrically coupled to a first end of the third liquid crystal capacitor, and a second end of the third liquid crystal capacitor is electrically coupled to the ground.

15. The liquid crystal display device of claim 11, wherein a relationship of a voltage $V_A$ applied to the main pixel, a voltage $V_B$ applied to the first subpixel, and a voltage $V_C$ applied to the second subpixel is: $V_A > V_B > V_C$.

* * * * *